United States Patent [19]

Wachi et al.

[11] Patent Number: 4,820,940

[45] Date of Patent: Apr. 11, 1989

[54] CONTROL CIRCUITS OPERATING WITH PULSE-WIDTH MODULATED SIGNALS

[75] Inventors: Shigeaki Wachi; Akashi Ito; Fumihiko Yoshii, all of Tokyo, Japan

[73] Assignee: Sony Corporation, Tokyo, Japan

[21] Appl. No.: 105,989

[22] Filed: Oct. 6, 1987

Related U.S. Application Data

[63] Continuation of Ser. No. 803,062, Nov. 8, 1985, abandoned.

[30] Foreign Application Priority Data

Mar. 12, 1984 [JP] Japan .................. 59-46710

[51] Int. Cl.$^4$ ................. H03K 5/153; H03K 3/01
[52] U.S. Cl. ................... 307/270; 307/355; 307/360; 307/228; 307/236
[58] Field of Search .............. 307/228, 494, 236, 355, 307/356, 357, 264, 265, 270, 268; 332/9 R, 9 T

[56] References Cited

U.S. PATENT DOCUMENTS

| | | | |
|---|---|---|---|
| 3,260,912 | 7/1966 | Gregory | 307/265 |
| 3,551,851 | 12/1970 | Engel | 307/265 |
| 3,742,697 | 7/1973 | Hama | 307/265 |
| 3,942,038 | 3/1976 | Hutch | 307/355 |
| 4,532,435 | 7/1985 | Wood | 307/265 |

FOREIGN PATENT DOCUMENTS

| | | | |
|---|---|---|---|
| 43-2802 | 2/1968 | Japan . | |
| 56-27001 | 6/1981 | Japan . | |
| 0211326 | 11/1984 | Japan | 307/494 |

OTHER PUBLICATIONS

Wallace, "Dual Channel Amp. System", IBM Tech. Bulletin, vol. 17, No. 12, May 75, pp. 3564–3566.

Viles, "Upper & Lower Threshold Can Be Set Indepently", Electronic Design, Dec. 30 1977, p. 176.

Primary Examiner—Stanley D. Miller
Assistant Examiner—Timothy P. Callahan
Attorney, Agent, or Firm—Lewis H. Eslinger; Jay H. Maioli

[57] ABSTRACT

A control circuit operating with a pulse-width modulated signal which is operative to control a driving circuit portion provided therein for driving a unit to be driven so as to operate in accordance with a pulse-width modulated control signal and in which an analog control signal is provided with a first DC voltage level at a biasing circuit portion (15), a triangular or saw-toothed waveform voltage signal which is obtained from a reference voltage producing circuit portion (17) with an amplitude varying in response to variations in a power supply voltage is superposed on both a second DC voltage level higher than the first DC voltage level and a third DC voltage level lower than the first DC voltage level, and a driving circuit portion (32) provide for driving a unit to be driven (43) is controlled with first and second pulse-width modulated control signals obtained from a level comparing circuit portion (30, 31) in which the level of the analog control signal provided with the first DC voltage level is compared respectively with the voltage level of the triangular or saw-toothed waveform voltage signal superposed on the second DC voltage level and with the voltage level of the triangular or saw-toothed waveform voltage signal superposed on the third DC voltage level. As a result of such arrangements, the control for the driving circuit portion (32) is stably carried out without requiring a specific power source stabilized particularly, and furthermore the power consumption caused by the unit to be driven (43) is effectively reduced.

4 Claims, 3 Drawing Sheets

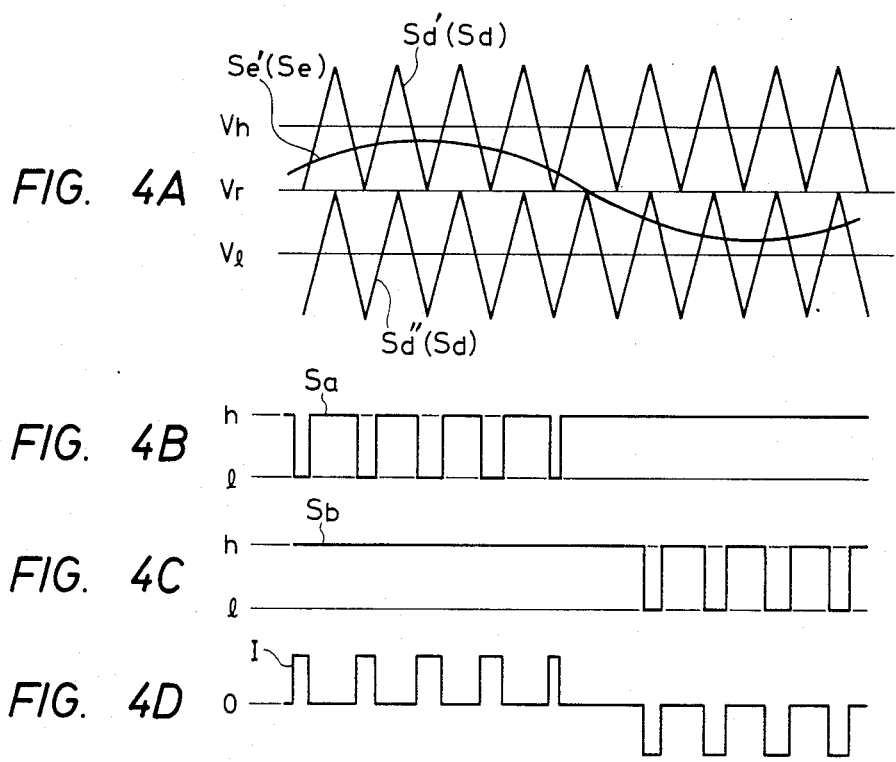

CONTROL CIRCUITS OPERATING WITH PULSE-WIDTH MODULATED SIGNALS

This is a continuation of application Ser. No. 803,062, filed 11-8-85 now abandoned.

TECHNICAL FIELD

The present invention relates to a control circuit operating with a pulse-width modulated signal, in which the current or voltage supply to a unit to be driven from a driving circuit portion provided for driving the unit to be driven is controlled in accordance with a control signal formed into a pulse-width modulated signal

TECHNICAL BACKGROUND

There has been proposed a signal reproducing system for reproducing information signals such as video signals and audio signals from a disc-shaped recording medium having record tracks in which the information signals are recorded with an alignment of pits. In the signal reproducing system, the record tracks on the recording medium are scanned by a light beam and variations which the light beam is subjected to are detected to reproduce the recorded information signals. Such a recorded information signal reproducing system is known as a video disc system, a digital audio disc system or the like. A reproducing apparatus for such a system is required to have automatic control operations respectively for maintaining the light beam, which is directed to the recording medium to scan the record tracks thereon, in correct tracking relation to each record track and for focusing the light beam properly on the record tracks while scanning the record tracks with the light beam. These automatic control operations for causing the light beam to impinge correctly upon the record tracks and for focusing the light beam properly on the record tracks are called tracking control and focusing control, respectively, and are usually carried out by driving an optical device, such as a lens or a mirror, partially constituting an optical head for causing the light beam to be directed to the record medium to control the position thereof with control signals which are obtained respectively in response to the tracking condition and the focusing condition of the light beam on the record medium.

In order to drive the optical device for such tracking control or focusing control, the reproducing apparatus is provided with a driving circuit which is operative to supply a driving current or voltage to an actuating device provided for the optical device in accordance with the control signal. As for driving the optical device in this way, it has been proposed to employ a control circuit operating with a pulse-width modulated signal which is operative to supply the control signal formed into a pulse-width modulated signal to the driving circuit with the intention of improving efficiency in driving.

A proposed control circuit which operates with a pulse-width modulated signal and employed for such a use as mentioned above is shown in FIG. 1 of the accompanying drawings. In the circuit of FIG. 1, an analog control signal Se as shown in FIG. 2A obtained for the tracking control is supplied to a terminal 1, and a triangular waveform signal Ss having a constant amplitude and a constant cyclic period, as shown also in FIG. 2A, is supplied to a terminal 2. The analog control signal Se and triangular waveform signal Ss are compared in voltage level with each other at a level comparator 3, and a pulse-width modulated signal $S_1$ which is given a high level h when the voltage level of the analog control signal Se is higher than that of the triangular waveform signal Ss and a low level l when the voltage level of the analog control signal Se is equal to or lower than that of the triangular waveform signal Ss so as to be formed into a series of pulses each having the width varying in response to variations in the voltage level of the analog control signal Se, as shown in FIG. 2B, is derived from the level comparator 3. The pulse-width modulated signal $S_1$ is supplied directly to one of the input terminals of a driving circuit 5 and also to an inverter 4. The pulse-width modulated signal $S_1$ supplied to the inverter 4 is subjected to level inversion thereat so as to be formed into an inverted pulse-width modulated signal $S_2$ as shown in FIG. 2C and this inverted pulse-width modulated signal $S_2$ is supplied to the other of the input terminals of the driving circuit 5.

The driving circuit 5 is operative to supply a driving current to an electromagnetic coil 6 constituting an actuating device for driving the optical device, for example, the lens or the mirror as aforementioned, and comprises a pair of complementary transistors 7 and 8 having respective bases connected in common to the input terminal to which the pulse-width modulated signal $S_1$ is supplied and another pair of complementary transistors 9 and 10 having respective bases connected in common to the input terminal to which the inverted pulse-width modulated signal $S_2$ is supplied. The transistors 7 and 8 are connected between a power source $+B_0$ and the ground with respective emitters coupled in common to make a connection point $P_1$ and the transistors 9 and 10 are also connected between the power source $+B_0$ and the ground with respective emitters coupled in common to make a connection point $P_2$. The electromagnetic coil 6 is connected between the connection points $P_1$ and $P_2$.

With the configuration described above, when the pulse-width modulated signal $S_1$ has the high level h and the inverted pulse-width modulated signal $S_2$ has the low level l, the transistors 7 and 10 are made conductive so that the electromagnetic coil 6 is supplied with a first driving current flowing therethrough from the connection point $P_1$ to the connection point $P_2$, and when the pulse-width modulated signal $S_1$ has the low level and the inverted pulse-width modulated signal $S_2$ has the high level h, the transistors 8 and 9 are made conductive so that the electromagnetic coil 6 is supplied with a second driving current flowing therethrough from the connection point $P_2$ to the connection point $P_1$. Accordingly, each duration in which the first driving current flows through the electromagnetic coil 6 and each duration in which the second driving current flows through the electromagnetic coil 6 are varied in response to the variations in the voltage level of the analog control signal Se.

However, in such a proposed control circuit, control gain G is determined to be in proportion to the ratio of a voltage $E_0$ of the power source $+B_0$ to the amplitude (peak to peak value) of the triangular waveform signal Ss, and therefore the control gain G is undesirably varied to exert a baneful influence upon the current supply to the electromagnetic coil 6 by the circuit if the voltage $E_0$ of the power source $+B_0$ varies. Accordingly, it is necessary to provide a stabilized power source supplying a constant voltage as the power source $+B_0$. In such a case, since the power source +B₀ constitutes a power supply for the driving circuit 5 which requires large power, the stabilized power source which is able to supply large power is required and this results is a problem that a burden on the circuit construction is increased. Further, in the proposed control circuit described above, the electromagnetic coil 6 is supplied always with the first or second driving current through the driving circuit 5 when the control circuit operates, and consequently the electromagnetic coil 6 causes considerably large power consumption

DISCLOSURE OF THE INVENTION

Accordingly, it is an object of the present invention to provide a control circuit operating with a pulse-width modulated signal which controls stably a driving circuit portion for driving a unit to be driven to operate in response to a pulse-width modulated control signal without requiring a power source stabilized particularly for supplying a constant voltage and is able to reduce effectively power consumption at the unit to be driven.

According to an aspect of the present invention, there is provided a control circuit operating with a pulse-width modulated signal, which comprises; a reference voltage producing circuit portion for generating a triangular or saw-toothed waveform voltage signal having an amplitude varying in response to variations in a power supply voltage, a first level comparing circuit portion for comparing the voltage level of an analog control signal provided with a first DC voltage level with the voltage level of the triangular or saw-toothed waveform voltage signal superposed on a second DC voltage level obtained by dividing the power supply voltage to be higher than the first DC voltage level and for producing a first pulse-width modulated control signal resulting from the level comparison carried out therein, a second level comparing circuit portion for comparing the voltage level of the triangular or saw-toothed waveform voltage signal superposed on a third DC voltage level obtained by dividing the power supply voltage to be lower than the first DC voltage level with the voltage level of the analog control signal provided with the first DC voltage and for producing a second pulse-width modulated control signal resulting from the level comparison carried out therein, and a driving circuit portion operative to drive a unit to be driven and supplied with the first and second pulse-width modulated control signals.

In the control circuit thus constituted in accordance with the present invention, the driving circuit portion is controlled to drive the unit to be driven in accordance with each pulse-width modulated control signal, which is obtained by converting the analog control signal into a pulse-width modulated control signal by the aid of the triangular or saw-toothed waveform voltage signal, with the control gain maintained to be substantially constant even if the power supply voltage is varied. Accordingly, it is not necessary to provide for the driving circuit portion any stabilized power source capable of supplying large power with the intention of maintaining the control gain to be constant and the driving circuit portion is appropriately controlled without requiring a power source stabilized particularly, so that the burden on the circuit configuration is considerably lightened. Further, the unit to be driven is supplied intermittently with a driving current through the driving circuit portion when the control circuit operates, and therefore the power consumption caused by the unit to be driven is effectively reduced.

BRIEF DESCRIPTION OF THE DRAWINGS

FIGS. 4A to 4D are waveform diagrams used for explaining the operation of the embodiment shown in FIG. 3.

EMBODIMENT MOST PREFERABLE FOR WORKING OF THE INVENTION

Figure 1:
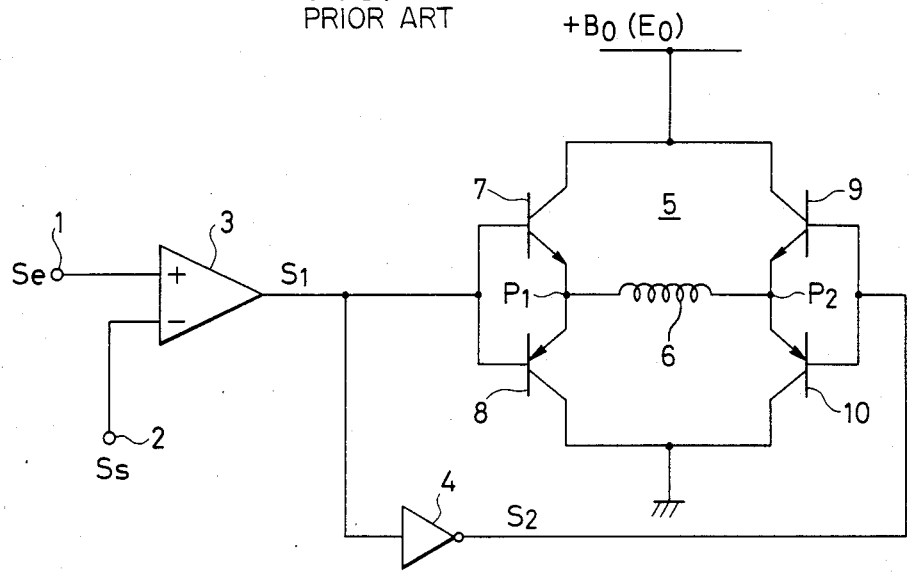
FIG. 1 is a schematic circuit diagram showing a previously proposed control circuit which operates with a pulse-width modulated signal.
Figure 2A:
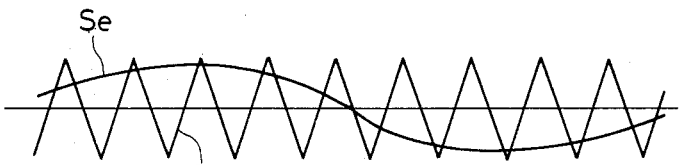
FIGS. 2A to 2C are waveform diagrams used for explaining the operation of the control circuit shown in FIG. 1.
Figure 2B:
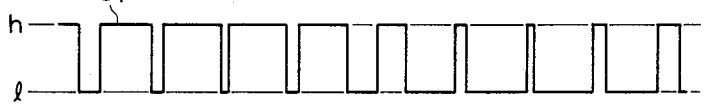
Figure 2C:
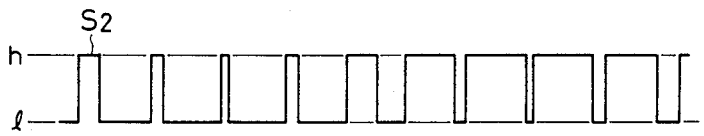
Figure 3:
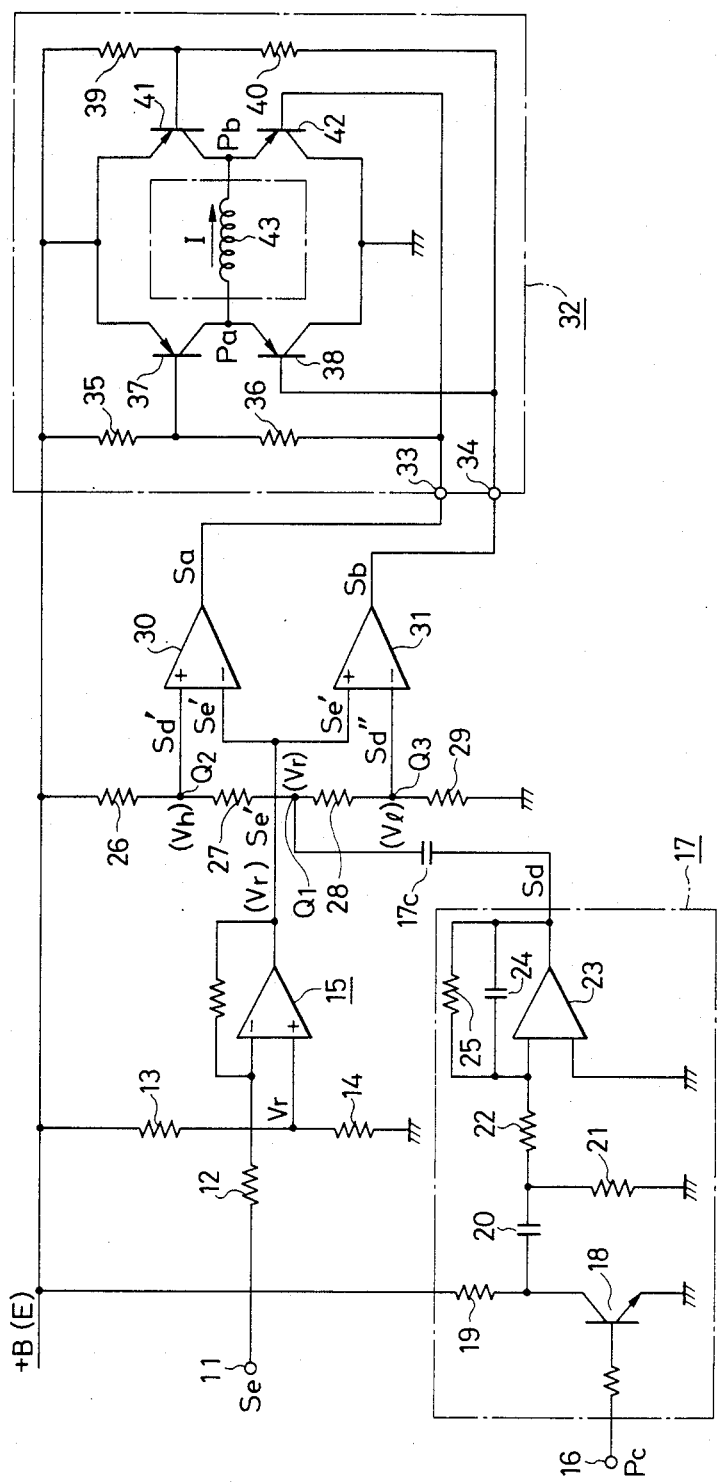
FIG. 3 is a schematic circuit diagram showing an embodiment of a control circuit operating with a pulse-width modulated signal according to the present invention.

Now, a preferred embodiment of the present invention will be described in detail with reference to the accompanying drawings hereinafter FIG. 3 shows an example of the control circuit operating with a pulse-width modulated signal according to the present invention. In this example, for example, the analog control signal Se as aforementioned is supplied to a terminal 11. The analog control signal Se from the terminal 11 is supplied through a resistor 12 to a biasing circuit 15 to which a biasing voltage level Vr obtained by dividing a power supply voltage E of the power source +B is applied, and at the output terminal of the biasing circuit 15, a modified analog control signal Se' which corresponds to the analog control signal Se superposed on the biasing voltage level Vr is obtained.

On the other hand, a clock pulse signal Pc having a constant cyclic period and a constant pulse-width of each pulse therein is supplied through a terminal 16 to a charging and discharging circuit 17 employing a Miller integrator. The charging and discharging circuit 17 has a switching transistor 18 which has a base supplied with the clock pulse signal Pc and is turned on and off selectively in response to the clock pulse signal Pc. An emitter of the switching transistor 18 is grounded and a collector of the switching transistor 18 is connected to the power source +B through a resistor 19. A series connection of a capacitor 20 and a resistor 21 is connected between the collector of the switching transistor 18 and the ground, and the connection point between the capacitor 20 and the resistor 21 is connected through a resistor 22 to one of input terminals of an operational amplifier 23. The other of the input terminals of the operational amplifier 23 is grounded and a parallel connection of a capacitor 24 and a resistor 25 is connected between an output terminal and the above mentioned one input terminal of the operational amplifier 23, so that the Miller integrator is formed.

In the charging and discharging circuit 17 thus constituted, the switching transistor 18 is made conductive for a constant duration cyclically at fixed periods by the clock pulse signal Pc, and a rectangular pulse voltage corresponding to the power supply voltage E is obtained cyclically at fixed periods at the collector of the swiching transistor 18 whenever the switching transistor 18 is made nonconductive. In accordance with this rectangular pulse voltage obtained at the collector of the switching transistor 18, charging and discharging are substantially carried out alternately in the Miller integrator including the operational amplifier 23 provided with the parallel connection of the capacitor 24 and the resistor 25, and as a result of this, a triangular waveform voltage signal Sd having a cyclic period corresponding to the cyclic period of the clock pulse signal Pc and an amplitude (peak to peak value) proportional to the power supply voltage E is generated at the output terminal of the operational amplifier 23, namely, the output terminal of the charging and discharging circuit 17. That is, the charging and discharging circuit 17 produces the triangular waveform voltage signal Sd which has the amplitude varying in response to variations in the power supply voltage E when the power supply voltage E is varied.

A voltage divider comprising a series connection of resistors 26, 27, 28 and 29 is connected between the power source +B and the ground. This voltage divider is so arranged as to produce a DC voltage level Vr which coincides with the biasing voltage level Vr applied to the biasing circuit 15 as mentioned above at a connection point $Q_1$ between the resistors 27 and 28, a DC voltage level Vh which is higher by a predetermined value corresponding to a half of the amplitude of the triangular waveform voltage signal Sd than the DC voltage level Vr at a connection point $Q_2$ between the resistors 26 and 27, and a DC voltage level Vl which is lower by the predetermined value corresponding to a half of the amplitude of the triangular waveform voltage signal Sd than the DC voltage level Vr at a connection point $Q_3$ between the resistors 28 and 29. With such an arrangement, the difference between the DC voltage levels Vh and Vl (Vh−Vl) is set to be coincident with the amplitude of the triangular waveform voltage signal Sd.

The output terminal of the charging and discharging circuit 17 is connected through a capacitor 17c to the connection point $Q_1$ of the voltage divider, so that the triangular waveform voltage signal Sd is supplied to the connection point $Q_1$. Accordingly, a modified triangular waveform voltage signal Sd' which corresponds to the triangular waveform voltage signal Sd superposed on the DC voltage level Vh, as shown in FIG. 4A, is obtained at the connection point $Q_2$, and another modified triangular waveform voltage signal Sd" which corresponds to the triangular waveform voltage signal Sd superposed on the DC voltage level Vl, as shown also in FIG. 4A, is obtained at the connection point $Q_3$. In such a situation, the bottom level of the modified triangular waveform voltage signal Sd' and the top level of the modified triangular waveform voltage signal Sd" are coincident with the DC voltage level Vr. Although the DC voltage levels Vr, Vh and Vl vary respectively so that the difference between the DC voltage levels Vh and Vr (Vh−Vr) and the difference between the DC voltage levels Vr and Vl (Vr−Vl) are varied when the power supply voltage E varies, the amplitude of the triangular waveform voltage signal Sd also varies in response to the variations in the power supply voltage E and consequently such relationship among the modified triangular waveform voltage signals Sd' and Sd" and the DC voltage level Vr as shown in FIG. 4A and described above is maintained notwithstanding the variations in the power supply voltage E.

The modified triangular waveform voltage signal Sd' obtained at the connection point $Q_2$ and the modified analog control signal Se' obtained at the output terminal of the biasing circuit 15 are supplied to a level comparator 30 to be compared in voltage level with each other therein, and a pulse-width modulated signal Sa which is given the high level h when the voltage level of the modified triangular waveform voltage signal Sd' is higher than that of the modified analog control signal Se' and the low level l when the voltage level of the modified triangular waveform voltage signal Sd' is equal to or lower than that of the modified analog control signal Se' so as to be formed into a signal containing pulses each having the width varying in response to variations in the voltage level of the modified analog control signal Se', as shown in FIG. 4B, is derived from the level comparator 30. Further, the modified analog control signal Se' and the modified triangular waveform voltage signal Sd" obtained at the connection point $Q_3$ are supplied to a level comparing circuit 31 to be compared in voltage level with each other therein, and a pulse-width modulated signal Sb which is given the high level h when the voltage level of the modified analog control signal Se' is higher than that of the modified triangular waveform voltage signal Sd" and the low level l when the voltage level of the modified analog control signal Se' is equal to or lower than that of the modified triangular waveform voltage signal Sd" so as to be formed into a signal containing pulses each having the width varying in response to variations in the voltage level of the modified analog control signal Se', as shown in FIG. 4C, is derived from the level comparator circuit 31.

The pulse-width modulated signals Sa and Sb thus obtained are supplied to input terminals 33 and 34 of a driving circuit 32, respectively. The driving circuit 32 comprises a pair of transistors 37 and 38 having respective collector-emitter paths coupled in series through a connection point Pa and connected between the power source +B and the ground and another pair of transistors 41 and 42 having respective collector-emitter paths coupled in series through a connection point Pb and connected between the power source +B and the ground in parallel with the collector-emitter paths of the transistors 37 and 38 coupled in sereis. Between the connection points Pa and Pb, an electromagnetic coil 43 for driving a unit to be driven, for example, an optical device such as the lens or mirror as aforementioned is connected. Further, bases of the transistors 37 and 41 are connected to the power source +B through resistors 35 and 39, respectively.

With such an arrangement, the pulse-width modulated signal Sa from the input terminal 33 is supplied to the base of the transistor 37 through a resistor 36 and to the base of the transistor 42 directly. Similarly, the pulse-width modulated signal Sb from the input terminal 34 is supplied to the base of the transistor 41 through a resistor 41 and to the base of the transistor 38 directly.

In the driving circuit 32 thus constituted, the transistors 37 and 42 are made nonconductive when the pulse-width modulated signal Sa has the high level h and made conductive when the pulse-width modulated signal Sa has the low level l, and similarly the transistors 41 and 38 are made nonconductive when the pulse-width modulated signal Sb has the high level h and made conductive when the pulse-width modulated signal Sb has the low level l. As understood clearly from FIGS. 4B and 4C, when the pulse-width modulated signal Sa has the low level l, the pulse width modulated signal Sb has the high level h, and when the pulse-width modulated signal Sb has the low level l, the pulse-width modulated signal Sa has the high level h. Accordingly, when the pulse-width modulated signal Sa has the low level l, only the transistors 37 and 42 are made conductive so that the electromagnetic coil 43 is supplied with a driving current I flowing therethrough in the direction from the connection point Pa to the connection point Pb, as indicated with an arrow in FIG. 3, and when the pulse-width modulated signal Sb has the low level l, only the transitors 41 and 38 are made conductive so that the electromagnetic coil 43 is supplied with the driving current I flowing therethrough in the direction from the connection point Pb to the connection point Pa opposite to the direction indicated with the arrow in FIG. 3. To the contrary, when both the pulse-width modulated signals Sa and Sb have the high level h, each of the transistors 37, 38, 41 and 42 is made non-conductive and therefore the electromagnetic coil 43 is not supplied with any driving current. In such a manner, the current supply to the electromagnetic coil 43 by the driving circuit 32 is controlled in accordance with the pulse-width modulated signals Sa and Sb, so that the driving current I flows intermittently through the electromagnetic coil 43, as shown in FIG. 4D, and each duration in which the driving current I flows continuously through the electromagnetic coil 43 and the direction of the driving current I flowing through the electromagnetic coil 43 are varied in response to the voltage level of the analog control signal Se.

As described above, since the electromagnetic coil 43 is supplied intermittently with the driving current I, the power consumption at the electromagnetic coil 43 is effectively reduced, and since the amplitude of each of the modified triangular waveform voltage signals Sd' and Sd" is varied in response to the variations in the power supply voltage E, the ratio of the power supply voltage E to the amplitude of each of the modified triangular waveform voltage signals Sd' and Sd" is kept almost constant, so that the control gain for the driving circuit 32 is maintained to be substantially constant notwithstanding the variations in the power supply voltage E.

Incidentally, although the triangular waveform voltage signal Sd is obtained from the charging and discharging circuit 17 to serve as a reference voltage signal used for converting the analog control signal Se into the pulse-width modulated signals Sa and Sb in the embodiment described above, it is possible to have such a modification that a saw-toothed waveform voltage signal is employed, instead of the triangular waveform voltage signal Sd, to serve as the reference voltage signal used for converting the analog control signal Se into the pulse-width modulated signals Sa and Sb.

APPLICABILITY FOR INDUSTRIAL USE

The control circuit according to the present invention is capable of controlling various movable devices requiring relatively large power for driving to be driven with improved driving efficiency, and is therefore suitable not only for being used to drive the optical device such as the lens or mirror employed in the reproducing apparatus for the video disc system, the digital audio disc system or the like, as aforementioned, but also for being used to drive any other actuator, for example, a solenoid plunger employed in various electronic apparatus.

We claim:

1. A control circuit operating with a power supply and a pulse-width modulated signal comprising;
    biasing circuit means (15) connected to the power supply and having an input terminal receiving an analog control signal for providing said analog control signal with a first DC voltage level varying in proportion to variations in a power supply voltage from said power supply,
    voltage generating circuit means (26, 27, 28, 29) connected to the power supply for producing a second DC voltage level higher than the first DC voltage level and varying in proportion to variations in the power supply voltage and a third DC voltage level varying in proportion to variations in the power supply voltage to be lower than the first DC voltage level by dividing the power supply voltage,
    reference voltage producing means (17) connected to the power supply for generating a triangular or saw-toothed waveform reference voltage signal having an amplitude varying in proportion to variations in the power supply voltage,
    first level comparing circuit means (30) connected to said biasing circuit means and said reference voltage producing means for comparing the analog control signal provided with the first DC voltage level with the voltage level of the reference voltage signal superposed on the second DC voltage level and for producing a first pulse-width modulated control signal resulting from the level comparison carried out therein,
    second level comparing circuit means (31) connected to said biasing circuit means and said reference voltage producing means for comparing the voltage level of the reference voltage signal superposed on the third DC voltage level with the voltage level of the analog control signal provided with the first DC voltage and for producing a second pulse-width modulated control signal resulting from the level comparison carried out therein,
    an electromagnetic coil, and
    driving circuit means (32) having first and second switching elements connected to respective ends of said electromagnetic coil to be supplied with said first pulse-width modulated control signal for driving said electromagnetic coil, and third and fourth switching elements connected to respective ends of said electromagnetic coil to be supplied with said second pulse-width modulated control signal for driving said electromagnetic coil.

2. A control circuit according to claim 1, wherein said voltage generating circuit means (26, 27, 28, 29) comprises a first resistor (26), a second resistor (27), a third resistor (28) and a fourth resistor (29) connected in series between said power supply voltage and ground with a first connecting point which is provided between said first and second resistors (26, 27) and at which the second DC voltage level is obtained, a second connecting point which is provided between said third and fourth resistors (28, 29) and at which the third DC voltage level is obtained, and a third connecting point which is provided between said second and third resistors (27, 28) and to which an output terminal of said reference voltage producing means (17) is connected.

3. A control circuit according to claim 1, wherein said reference voltage producing means (17) comprises a charging and discharging circuit employing a Miller integrator and including a switching transistor (18) that is turned on and off alternately with a predetermined clock pulse signal supplied thereto.

4. A tracking control circuit operating with a power supply and a pulse-width modulated signal comprising:

biasing circuit means connected to said power supply and having an input terminal for providing an analog signal for tracking control supplied to said input terminal with a first DC voltage level varying in proportion to variations in a power supply voltage form said power supply, voltage generating means connected to said power supply for producing a second DC voltage level varying in proportion to variations in the power supply voltage to be higher than the first DC voltage level and a third DC voltage level varying in proportion to variations in the power supply voltage to be lower than the first DC voltage level by dividing the power supply voltage, reference voltage producing means connected to the power supply for generating a reference voltage signal having one of a triangular waveform and a saw-toothed waveform with an amplitude varying in proportion to variations in the power supply voltage, first level comparing means for comparing the voltage level of the analog signal for tracking control provided with the first DC voltage level with the voltage level of the reference voltage signal superposed on the second DC voltage level and for producing a first pulse-width modulated control signal resulting from the level comparison carried out therein, second level comparing means for comparing the voltage level of the reference voltage signal superposed on the third DC voltage level with the voltage level of the analog signal for tracking control provided with the first DC voltage level and for producing a second pulse-width modulated control signal resulting from the level comparison carried out therein, and driving circuit means including an electromagnetic coil for driving an optical device, first and second switching elements connected respectively to both ends of said electromagnetic coil and connected to be supplied with the first pulse-width modulated control signal for driving said electromagnetic coil, and third and fourth switching elements connected respectively to both ends of said electromagnetic coil and connected to be supplied with the second pulse-width control signal for driving said electromagnetic coil.

* * * * *

UNITED STATES PATENT AND TRADEMARK OFFICE
CERTIFICATE OF CORRECTION

PATENT NO. : 4,820,940
DATED     : April 11, 1989
INVENTOR(S) : Shigeaki Wachi; Akasi Ito It is certified that error appears in the above-identified patent and that said Letters Patent is hereby corrected as shown below:

Col. 1, line 15, after "signal" insert --.--

Col. 2, line 47, after "level" insert --1--

Col. 3, line 11, after "consumption" insert --.--

Col. 4, line 23, after "hereinafter" insert --.--

Col. 6, line 64, change "pulse width" to --pulse-width--

IN CLAIMS:

Col. 8, line 15, delete "reference"

Col. 9, line 6, change "form" to --from--

Signed and Sealed this

Twenty-seventh Day of February, 1990

*Attest:*

JEFFREY M. SAMUELS

*Attesting Officer*       *Acting Commissioner of Patents and Trademarks*